United States Patent
Wei et al.

(10) Patent No.: US 12,527,176 B2
(45) Date of Patent: Jan. 13, 2026

(54) DISPLAY PANEL INCLUDING POWER CONNECTION LINES AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Feng Wei, Beijing (CN); Hongjun Zhou, Beijing (CN); Yudiao Cheng, Beijing (CN); Chao Wu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 654 days.

(21) Appl. No.: 17/800,248

(22) PCT Filed: Sep. 7, 2021

(86) PCT No.: PCT/CN2021/117041
§ 371 (c)(1),
(2) Date: Aug. 17, 2022

(87) PCT Pub. No.: WO2022/089015
PCT Pub. Date: May 5, 2022

(65) Prior Publication Data
US 2023/0062966 A1 Mar. 2, 2023

(30) Foreign Application Priority Data
Oct. 30, 2020 (CN) .......................... 202011198209.5

(51) Int. Cl.
*H10K 59/131* (2023.01)
*H10K 59/00* (2023.01)

(52) U.S. Cl.
CPC ........... *H10K 59/131* (2023.02); *H10K 59/00* (2023.02)

(58) Field of Classification Search
CPC ............................. H10K 59/131; H10K 59/00
(Continued)

(56) References Cited

U.S. PATENT DOCUMENTS

| 10,043,453 B2 * | 8/2018 | An ........................ G09G 3/3266 |
| 2006/0077144 A1 * | 4/2006 | Eom ........................ G09G 3/32 345/82 |

(Continued)

FOREIGN PATENT DOCUMENTS

| CN | 109656067 A | * | 4/2019 | ......... G02F 1/13452 |
| CN | 110956920 A | * | 4/2020 | |

(Continued)

*Primary Examiner* — Mohammad M Hoque
(74) *Attorney, Agent, or Firm* — XSENSUS LLP

(57) ABSTRACT

A display panel has a display area and a peripheral area surrounding the display area, and the peripheral area includes a first sub-peripheral area. A power loop line includes a sub-loop line. Each power connection line is electrically connected to the sub-loop line and a power bus. The at least two power connection lines are divided into two groups that are respectively located on two sides of a division line of the display panel. A plurality of data selectors are divided into two groups that are respectively located on the two sides of the division line. In at least one power connection line in a group and data selectors in a group that are all located on a same side of the division line, the at least one power connection line each passes through a gap between adjacent data selectors to connect the sub-loop line and the power bus.

20 Claims, 5 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2011/0102402 A1* | 5/2011 | Han | ................... | H10K 59/1315 |
| | | | | 438/34 |
| 2014/0159043 A1* | 6/2014 | Sakariya | ............. | H01L 25/0753 |
| | | | | 438/34 |
| 2015/0294988 A1* | 10/2015 | Hsieh | ................... | G02F 1/13452 |
| | | | | 257/72 |
| 2019/0103453 A1* | 4/2019 | Kang | ................... | G09G 3/3225 |
| 2020/0127217 A1* | 4/2020 | Bae | ...................... | H10K 71/231 |
| 2021/0134198 A1* | 5/2021 | Ma | ........................... | G09G 3/20 |
| 2023/0062966 A1* | 3/2023 | Wei | ...................... | H10K 59/131 |

FOREIGN PATENT DOCUMENTS

| | | | | |
|---|---|---|---|---|
| CN | 111564111 A | * | 8/2020 | ............... G09F 9/30 |
| CN | 112051691 A | * | 12/2020 | ......... G02F 1/13452 |

* cited by examiner

DISPLAY PANEL INCLUDING POWER CONNECTION LINES AND DISPLAY DEVICE

CROSS-REFERENCE TO RELATED APPLICATIONS

This application is a national phase entry under 35 USC 371 of International Patent Application No. PCT/CN 2021/117041 filed on Sep. 7, 2021, which claims priority to Chinese Patent Application No. 202011198209.5, filed on Oct. 30, 2020, which are incorporated herein by reference in their entirety.

TECHNICAL FIELD

The present disclosure relates to the field of display technologies, and in particular, to a display panel and a display device.

BACKGROUND

Organic light-emitting diode (OLED) display devices have the advantages of self-luminescence, wide color gamut, high contrast, low power consumption, and lightness and thinness, and are widely used in various fields. At present, a large screen-to-body ratio is one of development trends in the field of display technologies, and a narrow bezel of an organic light-emitting diode display device becomes a research focus.

SUMMARY

In an aspect, a display panel is provided. The display panel has a display area and a peripheral area surrounding the display area, and the peripheral area includes a first sub-peripheral area located on a side of the display area. The display panel includes a power bus, a power loop line, at least two power connection lines, a plurality of data selectors and a plurality of fan-out wirings.

The power bus is disposed in the first sub-peripheral area. The power loop line is disposed in the peripheral area. The power loop line includes a sub-loop line located in the first sub-peripheral area, and the sub-loop line is closer to the display area than the power bus. The at least two power connection lines are disposed between the power loop line and the power bus. An end of each power connection line is electrically connected to the sub-loop line, and another end of the power connection line is electrically connected to the power bus. The at least two power connection lines are divided into two groups that are respectively located on two sides of a division line of the display panel perpendicular to a first direction. The first direction is an extending direction of a portion, located at the first sub-peripheral area and away from the display area, of an edge of the display panel.

The plurality of data selectors are disposed between the sub-loop line and the power bus. The plurality of data selectors are divided into two groups that are respectively located on the two sides of the division line. In at least one power connection line in a group and data selectors in a group that are all located on a same side of the division line, the at least one power connection line each passes through a gap between adjacent data selectors to connect the sub-loop line and the power bus. The plurality of fan-out wirings are disposed between an edge of the display area proximate to the first sub-peripheral area and the plurality of data selectors. The plurality of fan-out wirings are divided into two groups that are respectively located on the two sides of the division line. Each data selector is electrically connected to at least one fan-out wiring.

In some embodiments, the display panel further includes a plurality of electrostatic discharge protection circuits disposed between the two groups of data selectors. In the first direction, a width of a gap between two adjacent electrostatic discharge protection circuits and a width of a gap between an electrostatic discharge protection circuit and a data selector that are closest to each other are each less than or equal to a width of each power connection line.

In some embodiments, in the first direction, a distance between the two groups of data selectors is in a range of 600 μm to 700 μm, inclusive.

In some embodiments, each fan-out wiring includes a wire body. Fan-out wirings belonging to a same group are divided into a first fan-out wiring part, a second fan-out wiring part and a third fan-out wiring part, and the second fan-out wiring part is located between the first fan-out wiring part and the third fan-out wiring part. The first fan-out wiring part and the third fan-out wiring part each include at least two adjacent fan-out wirings, and the second fan-out wiring part includes at least one fan-out wiring. Wire bodies of each fan-out wiring part are parallel to each other. An included angle between an extending direction of wire bodies of the fan-out wirings included in the first fan-out wiring part and the first direction is an acute angle, and an included angle between an extending direction of wire bodies of the fan-out wirings included in the third fan-out wiring part and the first direction is an acute angle. The extending direction of the wire bodies of the first fan-out wiring part and the extending direction of the wire bodies of the third fan-out wiring part intersect.

In some embodiments, the included angle between the extending direction of the wire bodies of the fan-out wirings included in the first fan-out wiring part and the first direction is in a range of 30° to 45°, inclusive. The included angle between the extending direction of the wire bodies of the fan-out wirings included in the third fan-out wiring part and the first direction is in a range of 30° to 45°, inclusive.

In some embodiments, each fan-out wiring further includes a first connection segment and a second connection segment that are respectively located at two ends of the wire body. An end of the first connection segment is electrically connected to the wire body, and another end of the first connection segment is electrically connected to a signal line in the display area. An end of the second connection segment is electrically connected to the wire body, and another end of the second connection segment is electrically connected to a corresponding data selector.

In some embodiments, a dimension of a region where the plurality of fan-out wirings are located in a second direction is in a range of 200 μm to 250 μm, inclusive. The second direction is perpendicular to the first direction.

In some embodiments, an orthographic projection of a power connection line in the at least two power connection lines on a display surface of the display panel is at least partially overlapped with an orthographic projection of at least one fan-out wiring on the display surface of the display panel.

In some embodiments, the sub-loop line of the power loop line extends in the first direction. An orthographic projection of the sub-loop line on the display surface of the display panel is at least partially overlapped with orthographic projections of the plurality of fan-out wirings on the display surface of the display panel.

In some embodiments, in the at least one power connection line in the group and the data selectors in the group that are all located on the same side of the division line, a ratio of a number of data selectors located between a power connection line closest to the division line and the division line to a total number of the data selectors in this group is in a range of 1:6 to 1:5, inclusive.

In some embodiments, a number of at least one power connection line included in each group is in a range of one to four power, inclusive.

In some embodiments, the at least one power connection line in each group includes a plurality of power connection lines, and two adjacent power connection lines in the plurality of power connection lines have at least one data selector therebetween.

In some embodiments, the division line is a midline of the display panel. A number of at least one power connection line included in each group is equal, and the power connection lines included in the two groups of power connection lines are arranged symmetrically with respect to the division line. A number of data selectors included in each group is equal, and the data selectors included in the two groups of data selectors are arranged symmetrically with respect to the division line.

In some embodiments, the at least two power connection lines include two power connection lines arranged symmetrically with respect to the division line. The plurality of fan-out wirings are equally divided into the two groups, and the two groups of fan-out wirings are arranged symmetrically with respect to the division line.

In another aspect, a display device is provided. The display device includes the display panel as described above.

In some embodiments, the width of each power connection line in the first direction is in a range of 180 μm to 220 μm, inclusive.

In some embodiments, the included angle between the extending direction of the wire bodies of the first fan-out wiring part and the first direction is equal to the included angle between the extending direction of the wire bodies of the third fan-out wiring part and the first direction.

In some embodiments, distances, each of which is a distance between wire bodies of two adjacent fan-out wirings that are parallel to each other, are equal.

In some embodiments, distances, each of which is a distance between first connection segments of two adjacent fan-out wirings, are greater than distances, each of which is a distance between second connection segments of two adjacent fan-out wirings.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method, and an actual timing of a signal involved in the embodiments of the present disclosure.

DETAILED DESCRIPTION

Figure 1A:
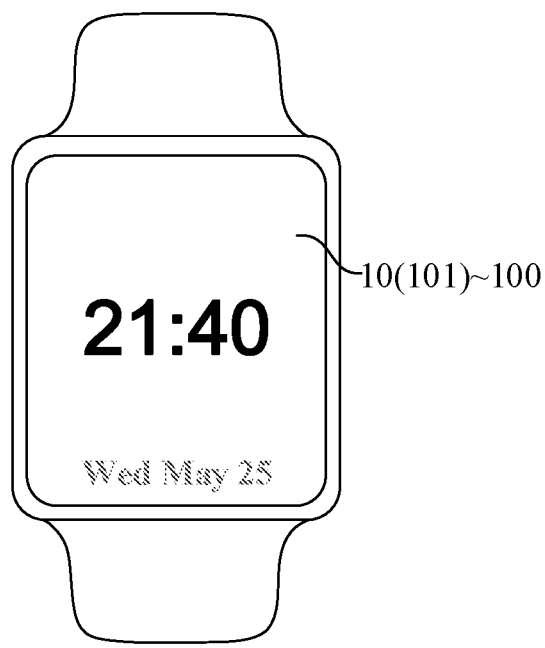
FIG. 1A is a structural diagram of a display device, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and extensions thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The use of the phase "applicable to" or "configured to" herein means an open and inclusive expression, which does not exclude devices that are applicable to or configured to perform additional tasks or steps.

As used herein, the term such as "about" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Figure 1B:
FIG. 1B is a structural diagram of another display device, in accordance with some embodiments of the present disclosure.

Some embodiments of the present disclosure provide a display device 100, as shown in FIGS. 1A and 1B. The display device 100 may be, for example, a mobile phone, a tablet computer, a personal digital assistant (PDA), a vehicle-mounted computer, or a wearable display device such as a watch. A specific form of the display device 100 is not limited in the embodiments of the present disclosure.

In some embodiments, the display device 100 is an OLED display device. For example, the display device 100 is a flexible OLED display device that may be used as a wearable display device. FIGS. 1A and 1B are structural diagrams of two wearable display devices (e.g., watches), respectively. Display screens of the wearable display devices each have a narrow bezel, a high screen-to-body ratio and a good display effect.

Figure 2:
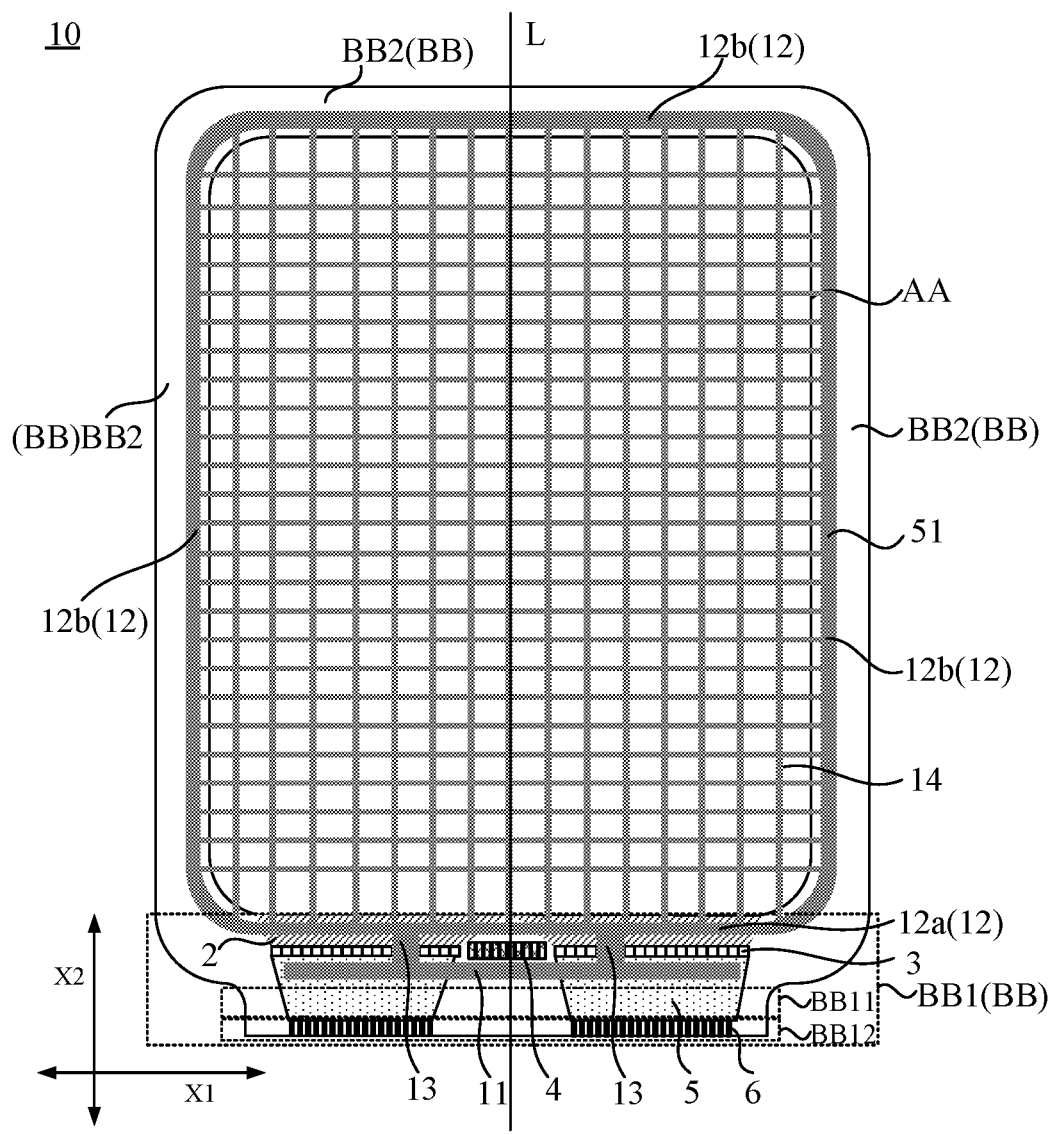
FIG. 2 is a structural diagram of a display panel, in accordance with some embodiments of the present disclosure.

As shown in FIGS. 1A, 1B and 2, the display device 100 provided in some embodiments of the present disclosure includes a display panel 10. The display panel has a display area AA and a peripheral area BB surrounding the display area AA. The peripheral area BB includes a first sub-peripheral area BB1 located on a side of the display area AA, and a second sub-peripheral area BB2 located on other three sides of the display area AA.

As shown in FIGS. 2 to 5, the display panel 10 includes a power bus 11, a power loop line 12, at least two power connection lines 13, a plurality of data selectors 3 and a plurality of fan-out wirings 2 that are all disposed in the peripheral area BB.

The power bus 11 is disposed in the first sub-peripheral area BB1, and the power loop line 12 is disposed in the peripheral area BB. For example, the power loop line 12 surrounds the display area AA. The power loop line 12 includes a sub-loop line 12a located in the first sub-peripheral area, and the sub-loop line 12a is closer to the display area AA than the power bus 11. The power loop line 12 further includes another portion 12b in addition to the sub-loop line 12a, and the another portion 12b is located in the second sub-peripheral area BB2. The power loop line 12 is configured to transmit a received voltage signal to the display area AA.

The at least two power connection lines 13 are disposed between the power loop line 12 and the power bus 11. An end of each power connection line 13 is electrically connected to the sub-loop line 12a, and another end of the power connection line 13 is electrically connected to the power bus 11. The power connection line 13 is configured to connect the power bus 11 and the sub-loop line 12a, so as to transmit the voltage signal from the power bus 11 to the power loop line 12. The at least two power connection lines 13 are divided into two groups that are respectively located on two sides of a division line L of the display panel 10 perpendicular to a first direction X1. The first direction X1 is an extending direction of a portion, located at the first sub-peripheral area BB1 and away from the display area AA, of an edge of the display panel 10, and a second direction X2 is perpendicular to the first direction X1. The edge of the display panel 10 refers to an outer contour of the display panel 10.

Figure 3:
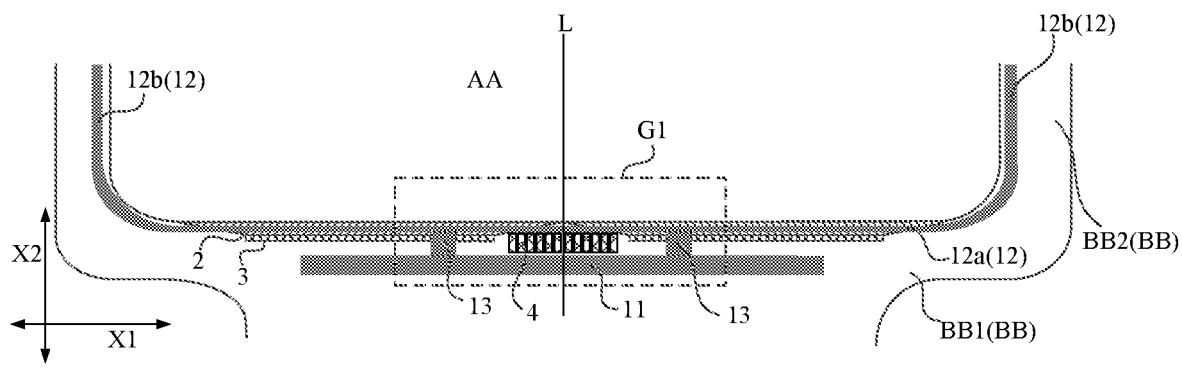
FIG. 3 is a structural diagram of another display panel, in accordance with some embodiments of the present disclosure.

The division line L divides the display panel 10 into two parts, i.e., left and right parts. In some examples, as shown in FIG. 3, the division line L is a midline of the display panel, and the midline equally divides the display panel into two parts, i.e., left and right parts. In some other examples, the division line L may be left or right with respect to the midline of the display panel 10, so as to divide the display panel into two parts with unequal areas.

The plurality of data selectors 3 are disposed between the sub-loop line 12a and the power bus 11. The plurality of data selectors 3 are divided into two groups that are respectively located on the two sides of the division line L. Each group of data selectors 3 include at least two data selectors 3 arranged in a line. In a group of power connection line(s) 13 and a group of data selectors 3 that are all located on a same side of the division line L, the power connection line 13 passes through a gap between two adjacent data selectors 3 to connect the sub-loop line 12a and the power bus 11.

For example, except data selectors 3 respectively located on two sides of the power connection line 13, two adjacent data selectors 3 in each group of data selectors have a very small gap therebetween, so that each group of data selectors 3 are more compact, and an area occupied by each group of data selectors 3 is reduced.

The plurality of fan-out wirings 2 are disposed between an edge of the display area AA proximate to the first sub-peripheral area BB1 and the plurality of data selectors 3. The plurality of fan-out wirings 2 are divided into two groups that are respectively located on the two sides of the division line L. Each data selector 3 is electrically connected to at least one fan-out wiring 2. The plurality of fan-out wirings 2 are configured to connect the plurality of data selectors 3 and the display area AA, so as to realize signal transmission.

Figure 5:
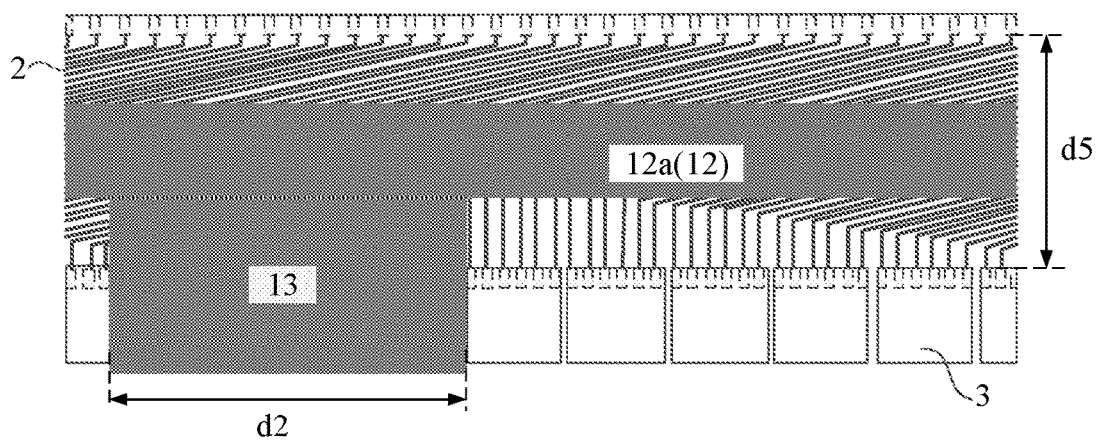
FIG. 5 is an enlarged view of the G2 region in FIG. 4.

For example, each data selector 3 is electrically connected to five to eight fan-out wirings 2. For example, as shown in FIG. 5, each data selector 3 is electrically connected to six fan-out wirings 2.

In some embodiments, in a case where the division line L is the midline of the display panel, the number of fan-out wirings included in each group of fan-out wirings 2 is equal, and the number of data selectors included in each group of data selectors 3 is equal.

In a case where the division line L is left or right with respect to the midline of the display panel 10, the number of fan-out wirings included in each group of fan-out wirings 2 and the number of data selectors 3 included in each group of data selectors 3 are accordingly set according to the position of the division line L. For example, in a case where the division line L is left with respect to the midline of the display panel 10, the number of fan-out wirings included in a group of fan-out wirings 2 located on a left side of the division line L is less than the number of fan-out wirings 2 included in another group of fan-out wirings 2 located on a right side of the division line L, and the number of data selectors 3 included in a group of data selectors 3 located on the left side of the division line L is less than the number of data selectors 3 included in another group of data selectors 3 located on the right side of the division line L. In a case where the division line L is right with respect to the midline of the display panel 10, the number of fan-out wirings included in a group of fan-out wirings 2 located on the left side of the division line L is greater than the number of fan-out wirings 2 included in another group of fan-out wirings 2 located on the right side of the division line L, and the number of data selectors 3 included in a group of data selectors 3 located on the left side of the division line L is greater than the number of data selectors 3 included in another group of data selectors 3 located on the right side of the division line L.

In some embodiments, the display panel 10 further includes a plurality of sub-pixels, a plurality of data lines, a plurality of gate lines and a plurality of power sub-lines 14 that are all disposed in the display area AA. For example, the plurality of sub-pixels are arranged in an array. Sub-pixels arranged in a row in the first direction X1 are referred to as a row of sub-pixels, and sub-pixels arranged in a column in the second direction X2 are referred to as a column of sub-pixels. The plurality of data lines extend in the second direction X2, and the plurality of gate lines extend in the first direction X1. A row of sub-pixels may be connected to a gate line, and a column of sub-pixels may be connected to a data line. In some examples, the plurality of fan-out wirings 2 are connected to the plurality of data lines in one-to-one correspondence, so that a fan-out wiring 2 corresponds to a column of sub-pixels. As shown in FIG. 2, the plurality of power sub-lines 14 include at least one power sub-line 14 extending in the first direction X1 and at least one power sub-lines 14 extending in the second direction X2. The plurality of power sub-lines 14 are in a form of a mesh. The plurality of power sub-lines 14 are electrically connected to the power loop line 12, and are configured to transmit the voltage signal from the power loop line 12 to the plurality of sub-pixels in the display area AA.

In the display panel 10, the at least two power connection lines 13 are disposed between the power loop line 12 and the power bus 11, and the at least two power connection lines 13 are divided into the two groups that are respectively located on the two sides of the division line L of the display panel 10 perpendicular to the first direction X1. In this way, compared with a structure in which a display panel in the related art shown in FIGS. 8 to 10 includes only a power connection line 13 located on a division line L of the display panel, the structure of the display panel 10 shown in FIG. 2 is able to reduce a dimension of a region where the plurality of fan-out wirings 2 are located in the second direction X2, which facilitates the narrow bezel. Moreover, by using this structure of the display panel 10, a signal strength difference of the voltage signal received by the sub-loop line 12a in the first direction X1 may be reduced, thereby improving a uniformity of the display brightness of the display area AA in the first direction X1.

Figure 8:
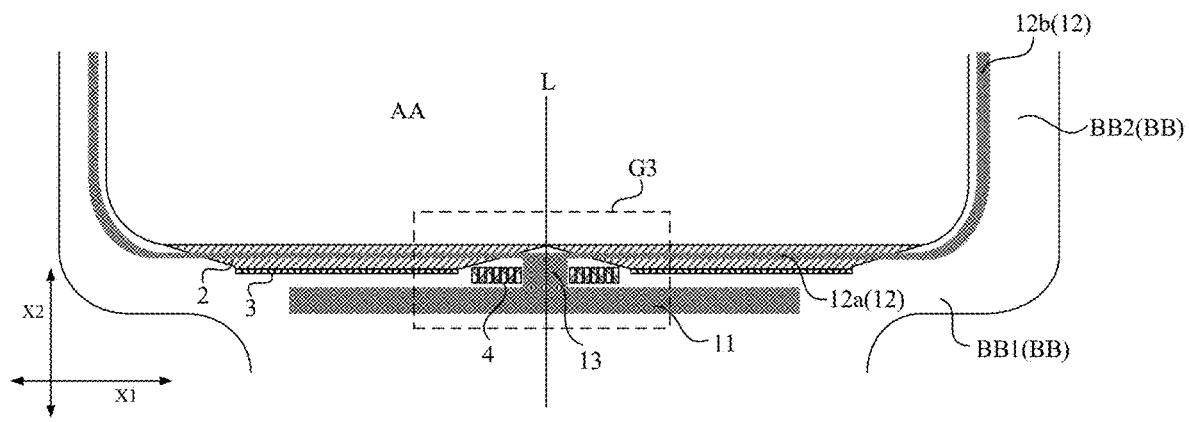
FIG. 8 is a structural diagram of a display panel, in accordance with the related art.
Figure 9:
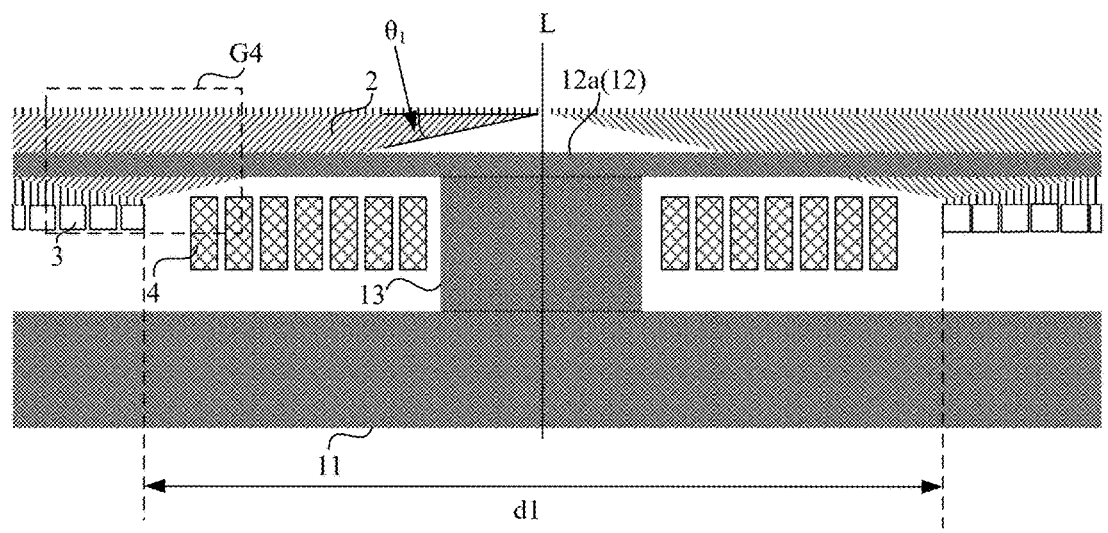
FIG. 9 is an enlarged view of the G3 region in FIG. 8.
Figure 10:
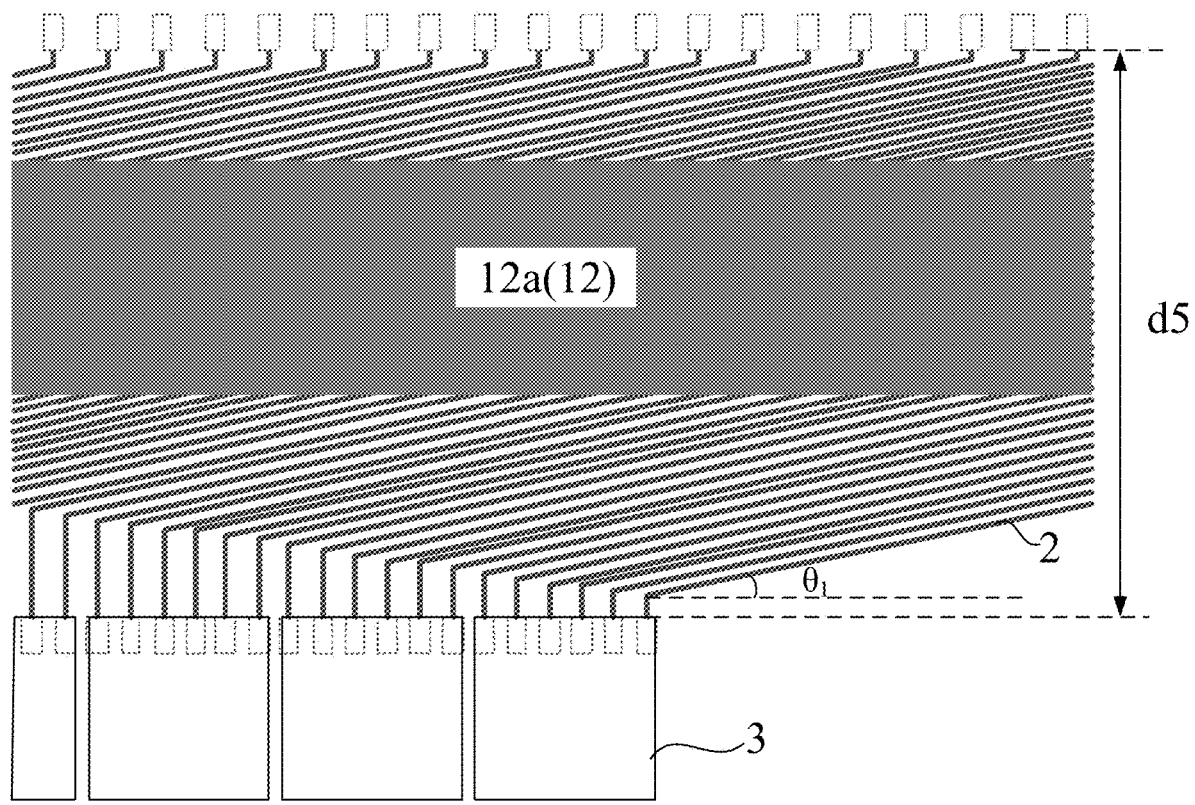
FIG. 10 is an enlarged view of the G4 region in FIG. 9.

Compared with the display panel in the related art, the display panel 10 provided in some embodiments of the present disclosure facilitates the narrow bezel for following reasons. As shown in FIGS. 8 to 10, the display panel in the related art includes only the power connection line 13 located on the division line L of the display panel. For example, the power connection line 13 is disposed at a middle position of a region between a power loop line 12 and a power bus 11, and this position is located between two groups of data selectors 3. In this way, part of a space between the two groups of data selectors 3 is occupied by the power connection line 13, so that a distance between the two groups of data selectors 3 in the first direction X1 is increased. A plurality of sub-pixels in a display area AA are divided into two parts along the division line L, i.e., a left part and a right part. The left part of sub-pixels and the right part of sub-pixels respectively correspond to two groups of data selectors 3, and respectively correspond to two groups of fan-out wirings 2. The two groups of data selectors 3 are far away from sub-pixel columns (i.e., sub-pixel columns located at a position of the division line L) located at a boundary of the left part of sub-pixels and the right part of sub-pixels, and in order to arrange each group of fan-out wirings 2, so that an inclination angle $\theta_1$ of an innermost fan-out wiring 2 in each group of fan-out wirings 2 is large. The innermost fan-out wiring 2 refers to a fan-out wiring 2 connecting a sub-pixel column located at the position of the division line L and an innermost data selector 3 in a group of data selectors 3 closest to the power connection line 13. Generally, the plurality of fan-out wirings 2 are arranged parallel to each other for reasonable wiring. An inclination angle of a fan-out wiring 2 refers to an included angle between an extending direction of a wire body of the fan-out wiring 2 and the first direction X1. The wire body of the fan-out wiring 2 refers to part of the fan-out wiring 2 that does not extend in the first direction X1 and the second direction X2.

It is found through verification that in a case where the number of the plurality of fan-out wirings 2 is unchanged, the larger the inclination angle of the fan-out wiring 2, the larger the required space in the second direction X2. Thus, in the related art, a dimension of a region where the plurality of fan-out wirings 2 are located in the second direction X2 is large, and a space occupied by the plurality of fan-out wirings 2 is large, so that a size of a first sub-peripheral area BB1 of the display panel is large.

In the embodiments of the present disclosure, as shown in FIGS. 2 to 5, since the at least two power connection lines 13 are disposed between the power loop line 12 and the power bus 11, and the at least two power connection lines 13 are divided into the two groups that are respectively located on the two sides of the division line L of the display panel 10 perpendicular to the first direction X1, a space between the two groups of data selectors 3 is not provided with a power connection line 13. In this way, in the first direction X1, a distance between the two groups of data selectors 3 is decreased, and the two groups of data selectors 3 are close to sub-pixel columns (i.e., sub-pixel columns located at a position of the division line L) located at a boundary of the left part of sub-pixels and the right part of sub-pixels, and an inclination angle θ of an innermost fan-out wiring 2 in each group of fan-out wirings 2 is greatly reduced. In the case where the number of the fan-out wirings 2 is unchanged, the dimension of the region where the plurality of fan-out wirings 2 are located in the second direction X2 is reduced accordingly, so that a dimension of the sub-peripheral area BB1 in the second direction X2 is able to be reduced, thereby facilitating the narrow bezel of the display panel 10.

Compared with the display panel in the related art, the display panel 10 provided in some embodiments of the present disclosure is able to improve the uniformity of the display brightness of the display area AA in the first direction X1 for following reasons. In the related art, as shown in FIGS. 8 to 10, a voltage signal transmitted by the power bus 11 is transmitted to the middle of a sub-loop line 12a through the power connection line 13. Next, the voltage signal is transmitted from left and right directions to the power loop line 12, and then, is transmitted to the sub-pixels through power sub-lines 14. In this way, due to a voltage drop of the power loop line 12, the voltage signal received by the sub-loop line 12a of the power loop line 12 has a large difference in strength. For example, the voltage signal has a larger strength at the middle of the sub-loop line 12a, and has a weaker strength at two ends of the sub-loop line 12a, so that in the first direction X1, the voltage signal received by the plurality of sub-pixels gradually decreases in strength from the middle to two sides of the display panel, which affects the uniformity of the display brightness of the display area AA.

As shown in FIG. 3, in the embodiments of the present disclosure, the voltage signal transmitted by the power bus 11 is transmitted to the power loop line 12 from at least two positions through the at least two power connection lines 13. In this way, compared with the related art, the voltage signal received by the sub-loop line 12a of the power loop line 12 has a small difference in strength, so that the voltage signal in the first direction X1 has a reduced difference in strength, and the plurality of sub-pixels receive the voltage signal with a uniform strength, thereby improving the uniformity of the display brightness of the display area AA.

In some embodiments, the display panel 10 includes the at least two power connection lines 13 that are divided into the two groups, and the number of power connection line(s) 13 included in each group of power connection line(s) 13 is in a range of one to four, inclusive.

In a case where each group of power connection lines 13 include at least two power connection lines 13, two adjacent power connection lines 13 have at least one data selector 3 therebetween, and the at least two power connection lines 13 are uniformly distributed in the first direction X1, so that the voltage signal received by the sub-loop line 12a has a further reduced difference in strength in the first direction X1, which is conducive to improving the display effect. Moreover, in each group of data selectors 3, the number of the at least one data selector 3 between two adjacent power connection lines 13 is equal. For example, the number of the at least one data selector between two adjacent power connection lines 13 is five.

In some embodiments, as shown in FIG. 3, the division line L is the midline of the display panel 10. The number of power connection line(s) 13 included in each group of power connection line(s) 13 is equal, and the power connection lines 13 included in the two groups of power connection lines 13 are arranged symmetrically with respect to the division line L. For example, the display panel 10 includes two power connection lines 13, and the two power connection lines 13 are divided into two groups that are respectively located on the two sides of the division line L. Moreover, the two power connection lines 13 are arranged symmetrically with respect to the division line L, and each power connection line 13 is equidistant from the division line L.

As shown in FIG. 3, the number of data selectors 3 included in each group of data selectors 3 is equal, and the data selectors 3 included in the two groups of data selectors 3 are arranged symmetrically with respect to the division line L. For example, the display panel 10 includes the plurality of data selectors 3 that are equally divided into two groups, and the two groups of data selectors 3 are arranged symmetrically with respect to the division line L. The number of data selectors 3 located between each power connection line 13 and the division line L is equal.

As shown in FIG. 3, the plurality of fan-out wirings 2 are equally divided into two groups that are respectively on the two sides of the division line L, and the two groups of fan-out wirings 2 are arranged symmetrically with respect to the division line L.

Figure 4:
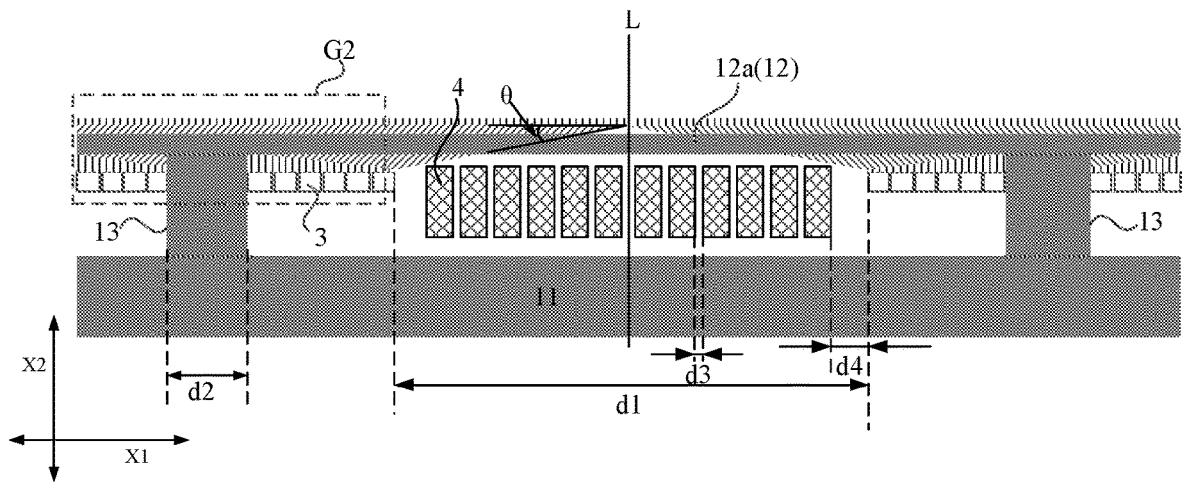
FIG. 4 is an enlarged view of the G1 region in FIG. 3.

In some embodiments, as shown in FIGS. 3 and 4, the display panel 10 further includes a plurality of electrostatic discharge protection circuits 4 disposed between the two groups of data selectors 3. The electrostatic discharge protection circuits 4 are configured to protect circuit structures in the display panel 10 from static electricity, so as to discharge or equalize high-voltage static electricity. For example, the plurality of electrostatic discharge protection circuits 4 are arranged in a row in the first direction X1.

In the first direction X1, a width of a gap d3 between two adjacent electrostatic discharge protection circuits 4 and a width of a gap d4 between an electrostatic discharge protection circuit 4 and a data selector 3 that are closest to each other are each less than or equal to a width of the power connection line 13. The width of the power connection line 13 refers to a dimension of each power connection line 13 in the first direction X1. For example, as shown in FIG. 4, the width d2 of the power connection line 13 is in a range of 180 μm to 220 μm, inclusive. For example, the width d2 of the power connection line 13 is 200 μm.

As shown in FIGS. 8 and 9, in the related art, since the power connection line is disposed at the position of the division line L in the first sub-peripheral area BB1, a plurality of electrostatic discharge protection circuits 4 are disposed on two sides of the power connection line 13, so that a region between the two groups of data selectors 3, which is occupied by the plurality of electrostatic discharge protection circuits 4 and the power connection line 13 as a whole, has a large area. Therefore, the distance between the two groups of data selectors 3 is large, so that the dimension of the region where the plurality of fan-out wirings 2 are located in the second direction X2 is increased. However, in the embodiments of the present disclosure, as shown in FIG. 4, in the first direction X1, two adjacent electrostatic discharge protection circuits 4 are not provided with a power connection line 13 therebetween, and the electrostatic discharge protection circuit 4 and the data selector 3 that are closest to each other are not provided with a power connection line 13 therebetween. That is, there is no space for providing the power connection line 13 between the two groups of data selectors 3, so that the plurality of electrostatic discharge protection circuits 4 and the plurality of data selectors 3 are arranged more compactly. Therefore, the distance between the two groups of data selectors 3 in the first direction X1 is reduced, so that the dimension of the region where the plurality of fan-out wirings 2 are located in the second direction X2 is decreased, which facilitates the narrow bezel of the display panel 10.

In some examples, in the first direction X1, the distance d1 between the two groups of data selectors 3 is in a range of 600 μm to 700 μm, inclusive. For example, in the first direction X1, the distance d1 between the two groups of data selectors 3 is 650 μm.

Figure 7:
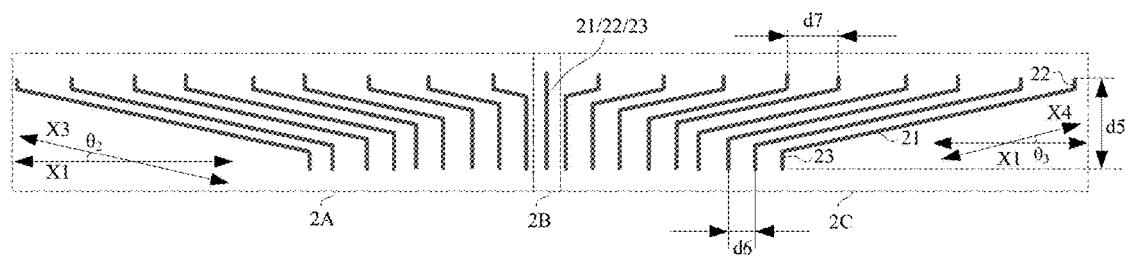
FIG. 7 is a structural diagram of a group of fan-out wirings in a display panel, in accordance with some embodiments of the present disclosure.

In some embodiments, as shown in FIG. 7, each fan-out wiring 2 includes a wire body 21, and an included angle of each of at least one wire body 21 and the first direction X1 is an acute angle.

Fan-out wirings 2 belonging to a same group are divided into a first fan-out wiring part 2A, a second fan-out wiring part 2B and a third fan-out wiring part 2C. The second fan-out wiring part 2B is located between the first fan-out wiring part 2A and the third fan-out wiring part 2C. The first fan-out wiring part 2A and the third fan-out wiring part 2C each include adjacent fan-out wirings 2, and the second fan-out wiring part 2B includes at least one fan-out wiring 2. Wire bodies 21 of fan-out wirings 2 included in each fan-out wiring part are parallel to each other.

An included angle $\theta_2$ between an extending direction of wire bodies 21 of the fan-out wirings 2 included in the first fan-out wiring part 2A and the first direction X1 is an acute angle. An included angle $\theta_3$ between an extending direction of wire bodies 21 of the fan-out wirings 2 included in the third fan-out wiring part 2C and the first direction X1 is an acute angle. The extending direction (i.e., third direction X3) of the wire bodies of the first fan-out wiring part 2A and the extending direction (i.e., fourth direction X4) of the wire bodies 21 of the third fan-out wiring part 2C intersect.

As shown in FIG. 3, in the first direction X1, a total dimension of each group of data selectors 3 is less than a total dimension of a plurality of columns of pixels in the display area AA connected to this group of data selectors 3. In the second direction X2, each group of fan-out wirings 2 are gradually converged from the display area AA to the plurality of data selectors 3. Therefore, a wire body 21 of each of at least one fan-out wiring 2 is inclined, and an included angle between the wire body 21 and the first direction X1 is an acute angle.

The fan-out wirings 2 belonging to the same group are divided into the first fan-out wiring part 2A, the second fan-out wiring part 2B and the third fan-out wiring part 2C from left to right. The extending direction of the wire bodies 21 of the first fan-out wiring part 2A is the third direction X3, and the extending direction of the wire bodies 21 of the third fan-out wiring part 2C is the fourth direction X4, so that each group of fan-out wirings 2 as a whole are converged inward.

The second fan-out wiring part 2B includes a fan-out wiring 2, and a wire body of this fan-out wiring 2 extends in the second direction X2. For example, the entire fan-out wiring 2 included in the second fan-out wiring part 2B extends in the second direction X2.

In some examples, the included angle $\theta_2$ between the extending direction of the wire bodies 21 of the first fan-out wiring part 2A and the first direction X1 is in a range of 30° to 45°, inclusive.

The included angle $\theta_3$ between the extending direction of the wire bodies 21 of the third fan-out wiring part 2C and the first direction X1 is in a range of 30° to 45°, inclusive.

As shown in FIG. 7, in a case where the first fan-out wiring part 2A and the third fan-out wiring part 2C are arranged symmetrically with respect to the fan-out wiring 2 included in the second fan-out wiring part 2B, the included angle $\theta_2$ between the extending direction of the wire bodies 21 of the first fan-out wiring part 2A and the first direction X1 is equal to the included angle $\theta_3$ between the extending direction of the wire bodies 21 of the third fan-out wiring part 2C and the first direction X1, such as 40°.

In some embodiments, as shown in FIG. 7, each fan-out wiring 2 further includes a first connection segment 22 and a second segment 23 that are respectively located at two ends of the wire body 21.

An end of the first connection segment 22 is electrically connected to the wire body 21, and another end of the first connection segment 22 is electrically connected to a signal line in the display area AA. For example, the another end of the first connection segment 22 is electrically connected to a data line in the display area AA. An end of the second connection segment 23 is electrically connected to the wire body 21, and another end of the second connection segment 23 is electrically connected to a corresponding data selector 3. The first connection segment 22 and the second connection segment 23 extend in the second direction X2.

As a possible design, as shown in FIG. 7, in each group of fan-out wirings 2, the first fan-out wiring part 2A and the third fan-out wiring part 2C are arranged symmetrically with respect to the fan-out wiring 2 included in the second fan-out wiring part 2B. Distances, each of which is a distance between wire bodies 21 of two adjacent fan-out wirings 2 that are parallel to each other, are equal. Distances d7, each of which is a distance d7 between first connection segments 22 of two adjacent fan-out wirings 2, are greater than distances, each of which is a distance d6 between second connection segments 23 of two adjacent fan-out wirings 2, so that the fan-out wirings 2 as a whole are converged inward, and the arrangement is more regular.

In some embodiments, as shown in FIG. 5, the dimension d5 of the region where the plurality of fan-out wirings 2 are located in the second direction X2 is in a range of 200 μm to 250 μm, inclusive. The second direction X2 is perpendicular to the first direction X1. For example, the dimension d5 of the region where the plurality of fan-out wirings 2 are located in the second direction X2 is 242.45 μm.

It is verified that in a case where 564 columns of pixels are disposed in the display area AA, i.e., in a case where 1692 columns of sub-pixels are disposed in the display area AA, the number of the plurality of fan-out wirings 2 is 1692. When the structural of the power connection line 13 and the data selectors 3 in the related art as shown in FIGS. 8 to 10 is used, the dimension d5 of the region where the plurality of fan-out wirings 2 are located in the second direction X2 is 317.45 μm. However, when the structure of the power connection lines 13 and the data selectors 3 provided in some embodiments of the present disclosure as shown in FIG. 5 is used, the dimension d5 of the region where the plurality of fan-out wirings 2 are located in the second direction X2 is 242.45 μm, so that the dimension of the region where the plurality of fan-out wirings 2 are located in the second direction X2 is small, which facilitates the narrow bezel of the display panel 10.

Figure 6:
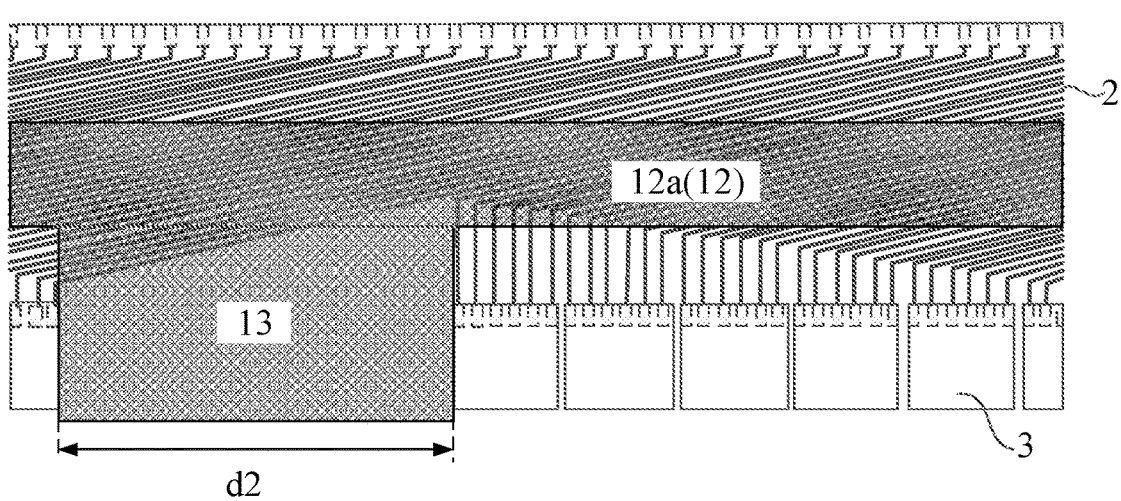
FIG. 6 is another enlarged view of the G2 region in FIG. 4.

In some embodiments, as shown in FIGS. 1A, 1B and 6, an orthographic projection of the power connection line 13 on a display surface 101 of the display panel is at least partially overlapped with orthographic projection(s) of at least one fan-out wiring 2 on the display surface 101 of the display panel 10.

In some embodiments, as shown in FIGS. 1A, 1B and 6, the sub-loop line 12a of the power loop line 12 extends in the first direction X1. An orthographic projection of the sub-loop line 12a on the display surface 101 of the display panel 10 is at least partially overlapped with orthographic projections of the plurality of fan-out wirings 2 on the display surface 101 of the display panel 10.

A film layer where the plurality of fan-out wirings 2 are located is located on a side of a film layer where the power connection lines 13 and the power loop line 12 are located away from the display surface of the display panel 10. That is, the plurality of fan-out wirings 2 are arranged in a different layer from the power connection lines 13, so that the plurality of fan-out wirings 2 do not need to avoid the power connection lines 13. Even if a position of the power connection line 13 is changed from the position of the division line L to a position of the two sides of the division line L, the arrangement of the plurality of fan-out wirings 2 is not affected by the position of the power connection line 13.

In some embodiments, the position of the power connection line 13 is related to a distribution of the data selectors 3. In a group of power connection line(s) 13 and a group of data selectors 3 that are all located on a same side of the division line L, a ratio of the number of data selector(s) 3 located between a power connection line 13 closest to the division line L and the division line L to the total number of this group of data selectors 3 is in a range of 1:6 to 1:5, inclusive.

For example, in a case where the display panel 10 includes the two power connection lines 13, the two sides of the division line L are each provided with a power connection line 13 and a group of data selectors 3. A group of data selectors 3 located on the left side of the division line L include 47 data selectors 3, and the number of data selectors 3 located between the power connection line 13 and the division line L is 9.

In some embodiments, as shown in FIG. 2, in addition to a region where the power bus 11, the power connection lines 13, the sub-loop line 12a, the plurality of fan-out wirings 2 and the plurality of data selectors 3 are disposed, the first sub-peripheral area BB1 of the display panel 10 further includes a bending region BB11 and a bonding region BB12. Dimensions of the bending region BB11 and the bonding region BB12 in the first direction X1 are less than a dimension of a body portion of the display panel 10 in the first direction X1, so that the bending region BB11 and bonding region BB12 are shrunken with respect to the display area AA. The bending region BB11 is located on a side of the power bus 11 away from the display area AA, and the bonding region BB12 is located on a side of the bending region BB11 away from the display area AA.

The display panel 10 further includes a plurality of second fan-out wirings 5 and a plurality of bonding electrodes 6, and the plurality of second fan-out wirings 5 connect the plurality of data selectors 3 and the plurality of bonding electrodes 6. The plurality of electrodes 6 are located in the bonding region BB12, and are configured to be bonded to a driver chip. For example, the driver chip includes a source driver. The source driver is configured to output data signals. The data signals are gated by the plurality of data selectors 3, and then transmitted to the plurality of sub-pixels in the display area AA, so as to control the display panel 10 to display.

In some embodiments, the display panel 10 is bent at the bending region BB11, so that the driver chip is disposed on a back surface of the display panel 10, which further reduces the size of the bezel of the display panel 10. In some examples, in the first sub-peripheral area BB1 of the display panel 10, in the second direction X2, a distance between the display area AA and the bending region BB11 is in a range of 1000 µm to 1300 µm, inclusive. For example, the distance between the display area AA and the bending region BB11 is 1100 µm.

The display device 100 provided in some embodiments of the present disclosure includes the display panel 10. Since the display panel 10 has the design in which the at least two power connection lines 13 are arranged on the two sides of the division line L of the display panel 10, the dimension of the region where the plurality of fan-out wirings 2 are located in the second direction X2 is able to be reduced, so that a size of the peripheral area of the display panel 10 is reduced. Thus, the display panel 10 provided in some embodiments of the present disclosure has a narrow bezel and an increased screen-to-body ratio, thereby improving the display effect.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a display area and a peripheral area surrounding the display area, the peripheral area including a first sub-peripheral area located on a side of the display area; the display panel comprising:
   a power bus disposed in the first sub-peripheral area;
   a power loop line disposed in the peripheral area; wherein the power loop line includes a sub-loop line located in the first sub-peripheral area, and the sub-loop line is closer to the display area than the power bus;
   at least two power connection lines disposed between the power loop line and the power bus; wherein an end of each power connection line is electrically connected to the sub-loop line, and another end of the power connection line is electrically connected to the power bus; the at least two power connection lines are divided into two groups that are respectively located on two sides of a division line of the display panel; wherein a first direction is an extending direction of a portion, located at the first sub-peripheral area and away from the display area, of an edge of the display panel; and the division line is perpendicular to the first direction;
   a plurality of data selectors disposed between the sub-loop line and the power bus; wherein the plurality of data selectors are divided into two groups that are respectively located on the two sides of the division line; and in at least one power connection line in a group and data selectors in a group that are all located on a same side of the division line, the at least one power connection line each passes through a gap between adjacent data selectors to connect the sub-loop line and the power bus; and
   a plurality of fan-out wirings disposed between an edge of the display area proximate to the first sub-peripheral area and the plurality of data selectors; wherein the plurality of fan-out wirings are divided into two groups that are respectively located on the two sides of the division line; and each data selector is electrically connected to at least one fan-out wiring.

2. The display panel according to claim 1, further comprising:
   a plurality of electrostatic discharge protection circuits disposed between the two groups of data selectors; wherein
   in the first direction, a width of a gap between two adjacent electrostatic discharge protection circuits and a width of a gap between an electrostatic discharge protection circuit and a data selector that are closest to each other are each less than or equal to a width of the power connection line.

3. The display panel according to claim 2, wherein in the first direction, a distance between the two groups of data selectors is in a range of 600 μm to 700 μm, inclusive.

4. The display panel according to claim 1, wherein each fan-out wiring includes a wire body;
fan-out wirings belonging to a same group are divided into a first fan-out wiring part, a second fan-out wiring part and a third fan-out wiring part, and the second fan-out wiring part is located between the first fan-out wiring part and the third fan-out wiring part; the first fan-out wiring part and the third fan-out wiring part each include at least two adjacent fan-out wirings, and the second fan-out wiring part includes at least one fan-out wiring; and wire bodies of each fan-out wiring part are parallel to each other; and
an included angle between an extending direction of wire bodies of the first fan-out wiring part and the first direction is an acute angle, and an included angle between an extending direction of wire bodies of the third fan-out wiring part and the first direction is an acute angle; and the extending direction of the wire bodies of the first fan-out wiring part and the extending direction of the wire bodies of the third fan-out wiring part intersect.

5. The display panel according to claim 4, wherein the included angle between the extending direction of the wire bodies of the first fan-out wiring part and the first direction is in a range of 30° to 45°, inclusive; and
the included angle between the extending direction of the wire bodies of the third fan-out wiring part and the first direction is in a range of 30° to 45°, inclusive.

6. The display panel according to claim 4, wherein each fan-out wiring further includes a first connection segment and a second connection segment that are respectively located at two ends of the wire body;
an end of the first connection segment is electrically connected to the wire body, and another end of the first connection segment is electrically connected to a signal line in the display area; and
an end of the second connection segment is electrically connected to the wire body, and another end of the second connection segment is electrically connected to a corresponding data selector.

7. The display panel according to claim 6, wherein a dimension of a region where the plurality of fan-out wirings are located in a second direction is in a range of 200 μm to 250 μm, inclusive; wherein the second direction is perpendicular to the first direction.

8. The display panel according to claim 1, wherein an orthographic projection of a power connection line in the at least two power connection lines on a display surface of the display panel is at least partially overlapped with an orthographic projection of at least one fan-out wiring on the display surface of the display panel.

9. The display panel according to claim 1, wherein the sub-loop line of the power loop line extends in the first direction; and an orthographic projection of the sub-loop line on the display surface of the display panel is at least partially overlapped with orthographic projections of the plurality of fan-out wirings on the display surface of the display panel.

10. The display panel according to claim 1, wherein in the at least one power connection line in the group and the data selectors in the group that are all located on the same side of the division line, a ratio of a number of data selectors located between a power connection line closest to the division line and the division line to a total number of the data selectors in this group is in a range of 1:6 to 1:5, inclusive.

11. The display panel according to claim 1, wherein a number of at least one power connection line included in each group is in a range of one to four power, inclusive.

12. The display panel according to claim 11, wherein the at least one power connection line in each group includes a plurality of power connection lines, and two adjacent power connection lines in the plurality of power connection lines have at least one data selector therebetween.

13. The display panel according to claim 1, wherein the division line is a midline of the display panel; wherein
a number of at least one power connection line included in each group is equal, and the power connection lines included in the two groups of power connection lines are arranged symmetrically with respect to the division line; and
a number of data selectors included in each group is equal, and the data selectors included in the two groups of data selectors are arranged symmetrically with respect to the division line.

14. The display panel according to claim 13, wherein
the at least two power connection lines include two power connection lines arranged symmetrically with respect to the division line; and
the plurality of fan-out wirings are equally divided into the two groups, and the two groups of the fan-out wirings are arranged symmetrically with respect to the division line.

15. A display device, comprising the display panel according to claim 1.

16. The display panel according to claim 2, wherein the width of each power connection line in the first direction is in a range of 180 μm to 220 μm, inclusive.

17. The display panel according to claim 4, wherein the included angle between the extending direction of the wire bodies of the first fan-out wiring part and the first direction is equal to the included angle between the extending direction of the wire bodies of the third fan-out wiring part and the first direction.

18. The display panel according to claim 4, wherein distances, each of which is a distance between wire bodies of two adjacent fan-out wirings that are parallel to each other, are equal.

19. The display panel according to claim 6, wherein distances, each of which is a distance between first connection segments of two adjacent fan-out wirings, are greater than distances, each of which is a distance between second connection segments of two adjacent fan-out wirings.

20. The display panel according to claim 2, wherein each fan-out wiring includes a wire body;
fan-out wirings belonging to a same group are divided into a first fan-out wiring part, a second fan-out wiring part and a third fan-out wiring part, and the second fan-out wiring part is located between the first fan-out wiring part and the third fan-out wiring part; the first fan-out wiring part and the third fan-out wiring part each include at least two adjacent fan-out wirings, and the second fan-out wiring part includes at least one fan-out wiring; and wire bodies of each fan-out wiring part are parallel to each other; and
an included angle between an extending direction of wire bodies of the first fan-out wiring part and the first direction is an acute angle, and an included angle between an extending direction of wire bodies of the third fan-out wiring part and the first direction is an acute angle; and the extending direction of the wire bodies of the first fan-out wiring part and the extending direction of the wire bodies of the third fan-out wiring part intersect.

\* \* \* \* \*